(12) United States Patent
Duerig et al.

(10) Patent No.: US 7,474,602 B2
(45) Date of Patent: Jan. 6, 2009

(54) DATA STORAGE DEVICE COMPRISING WRITE HEAD WITH CARBON ELEMENT

(75) Inventors: Urs T. Duerig, Rueschlikon (CH); Bernd W. Gotsmann, Horgen (CH); Mark A. Lantz, Zurich (CH); Peter Vettiger, Langnau am Albis (CH)

(73) Assignee: International Business Machines Corporation, Armonk, NY (US)

( * ) Notice: Subject to any disclaimer, the term of this patent is extended or adjusted under 35 U.S.C. 154(b) by 715 days.

(21) Appl. No.: 10/852,668

(22) Filed: May 24, 2004

(65) Prior Publication Data

US 2005/0018588 A1 Jan. 27, 2005

(30) Foreign Application Priority Data

Jun. 19, 2003 (EP) ................... 03405443

(51) Int. Cl.
*G11B 7/00* (2006.01)
*G11B 9/00* (2006.01)

(52) U.S. Cl. ...................... 369/100; 369/126
(58) Field of Classification Search ................. None
See application file for complete search history.

(56) References Cited

U.S. PATENT DOCUMENTS

| 5,747,120 A * | 5/1998 | McLean et al. ............. 427/596 |
| 5,835,477 A * | 11/1998 | Binnig et al. ................ 369/126 |
| 6,159,742 A | 12/2000 | Lieber et al. |
| 6,519,221 B1 | 2/2003 | Manalis et al. |
| 2001/0038598 A1 * | 11/2001 | Despont et al. ............. 369/126 |
| 2002/0110177 A1 * | 8/2002 | Nakayama et al. ............ 374/44 |
| 2004/0125733 A1 * | 7/2004 | Lee et al. ..................... 369/101 |

OTHER PUBLICATIONS

Kim, P., L. Shi, A. Majumdar and P.L. McEuen, "Thermal Transport Measurements of Individual Nanotubes", The American Physical Society, Jun. 1, 2001; published Oct. 31, 2001, vol. 87, No. 21 (Nov. 19, 2001); pp. 215502-1-215502-4.

Berber, Savas, Young-Kyun Kwon and David Tomnaek, "Unusually High Thermal Conductivity of Carbon Nanotubes", The American Physical Society, Feb. 23, 2000; vol. 84, No. 20 (May 15, 2000); pp. 4613-4616.

Vettiger, P. et al., "The "Millipede"—More than one thousand tips for future AFM data storage"; IBM J. Res. Develop., vol. 44, No. 3, May 2000, pp. 323-340.

* cited by examiner

*Primary Examiner*—Joseph H. Feild
*Assistant Examiner*—Christopher R Lamb
(74) *Attorney, Agent, or Firm*—F. Chau & Associates, LLC

(57) ABSTRACT

A data storage device is introduced. The data storage device comprises a write head. The write head comprises a heating element and a tip. The write head scans a data storage medium, wherein in an operation mode of the data storage device the tip is in contact with a surface of the data storage medium and heat is applied to the tip by means of the heating element. In order to achieve a good thermal contact between the tip and the data storage medium, the tip comprises a carbon element that is at least partially in contact with the surface in that operation mode. Such a write head can also be applied in the field of scanning probe lithography.

15 Claims, 3 Drawing Sheets

DATA STORAGE DEVICE COMPRISING WRITE HEAD WITH CARBON ELEMENT

FIELD OF THE INVENTION

The present invention relates generally to probe-based, and in particular AFM (Atomic Force Microscope)-based data storage systems. In particular it relates to the ultra high density data storage systems of the type which have a tip directed in contact with the storage medium by which bit-writing and bit-reading are carried out. It also relates to the field of scanning probe lithography.

BACKGROUND OF THE INVENTION

The Atomic Force Microscope is a well-known device in which the topography of a sample is sensed by a tip mounted on the end of a microfabricated cantilever. As the sample is scanned, the force interaction between the tip and the sample surface causes pivotal deflection of the cantilever. The sample topography is determined by detecting this deflection.

Such an Atomic Force Microscope is shown in U.S. Pat. No. 6,159,742, where the tip used in this microscopy includes a carbon nanotube for better revealing the chemical characteristics of a sample.

With regard to nanotubes, "Unusually High Thermal Conductivity of Carbon Nanotubes", Savas Berber et al., Physical Review Letters, Vol. 84, No. 20, 15 May 2000, and "Thermal Transport Measurements of Individual Multiwalled Nanotubes", P. Kim et al., Physical Review Letters, Vol. 87, No. 21, 19 Nov. 200, both describe the thermal characteristics of carbon nanotubes as such.

According to "Nanoindentation of Polycarbonate Using Carbon Nanotube Tip", Seiji Akita et al., Jpn. J. Appl. Phys. Vol. 39 (2000), pp. 7086-7089, Part 1, No. 12B, December 2000, first experiments are reported where a carbon nanotube is used for generating nanoindentation on a polycarbonate medium by applying exclusively a mechanical force to the nanotube. So does U.S. Pat. No. 6,519,221 B1.

The AFM technology has also been applied to the field of data storage with a view to providing a new generation of high-density, high data-rate data storage devices for mass-memory applications. AFM-based data storage is described in detail in IEEE Transactions on Nanotechnology, Volume 1, number 1, pages 39 to 55, Vettinger et al., and in IBM Journal of Research & Development, Volume 44, No. 3, May 2000, pp323-340, "The 'Millipede'—More Than One Thousand Tips for Future AFM Data Storage", Vettiger et al., and the references cited therein.

The cantilever-mounted tip, referred to also as the read/write tip, is used for reading and writing of data on the surface of a data storage medium. In operation, the read/write tip is biased against the surface of the data storage medium. The storage medium generally comprises a polymeric material.

In the write mode, the read/write tip is heated which results in heat transfer to the polymer surface layer causing local softening of the polymer. This allows the tip to penetrate the surface layer to form a pit, or bit indentation; such a pit represents a bit of value "1", a bit of value "0" being represented by the absence of a pit. This technique is referred to as thermomechanical writing.

The storage medium can be moved relative to the read/write head allowing the tip to write data over an area of the surface, or "storage field", corresponding to the field of movement. Each indentation is created by heating the cantilever tip and with the application of force pressing this tip into the polymer film. The tip is heated by passing a current through a resistive heating element integrated in the cantilever, directly behind the tip. Some of the heat generated in the resistor is conducted through the tip and into the polymer film, locally heating a small volume of the polymer. If sufficient heat is transferred to raise the temperature of the polymer above a certain temperature (which is dependent on the chosen polymer), the polymer softens and the tip sinks in, creating an indentation or bit.

In the read mode, the storage field is scanned by the tip, the position of the tip and the cantilever on which the tip is mounted differs according to the presence or absence of a pit. The reading operation uses thermomechanical sensing based on the principle that the thermal conductance between the cantilever, and components attached thereto, and the storage substrate, changes according to the distance between them; the distance is reduced as the tip moves into a bit indentation. Further discussion of the reading operation can be found in the above identified IBM Journal of Research & Development article.

In a multi-cantilever/tip device such as "Millipede", multiple simultaneous operations can be carried on in a common polymer substrate by individually addressing each bit location. By virtue of the nanometer length-scale of each operation, this array of multiple bit locations in sum occupies a minimum amount of space constituting an ultrahigh density 'reactor'. Data are stored by making nanoscopic indentations in a thin polymer film using a highly parallel array of cantilevers. As described above, at each position, an indentation or pit represents a 1 and no indentation or pit represents a 0, therefore data can be stored in a traditional binary sense via the presence or absence of nanoscopic indentations in the thin polymer film which serves as the storage medium.

The efficiency of the local heating process used for writing and/or erasing bits depends on the efficiency with which heat is transported through the point of contact between the tip and the polymer film of the data storage medium.

Thus, the present invention seeks to provide a way to significantly improve the efficiency of the heat transfer between the heating element and the polymer data storage medium. In addition, the present invention seeks to provide a way to significantly improve the efficiency of the heat transfer between the heating element and a medium via a tip in general.

SUMMARY OF THE INVENTION

The present invention provides a data storage device comprising at least one write head. The write head comprises a heating element and a tip. Further on, the data storage device comprises a data storage medium. In an operation mode of the data storage device, the tip is in contact with a surface of the data storage medium and heat is applied to the tip by means of the heating element. The tip comprises a carbon element that is at least partially in contact with the surface in that operation mode.

By implementing at least a part of the tip as a carbon element, heat transfer between the heating element and the data storage medium is improved.

The increased efficiency of heat transfer results in a reduced power consumption. Less power is to be used for writing a bit, which is an important factor in particular for mobile applications where power is limited due to battery capacity.

The increased efficiency of heat transfer also affects the time to write a bit, which means that data can be written faster, increasing the maximum data rate during writing for a fixed power consumption.

The operation mode can comprise a writing operation for writing information on the data storage medium. Alternatively or in addition, the operation mode can comprise an erasing operation for erasing information from the data storage medium. In addition, the operation mode can comprise a reading operation for reading information from the data storage medium. The write head is not limited to perform write or erase operations. The write head can be realized as a combined read/write head that is used for read and write operations.

Heat is typically not continuously applied to the tip during the entire operation mode. Moreover, heat can be selectively applied to the tip, e.g. only when the write head faces a position of the data storage medium where a pit should be written into the data storage medium. The tip might be in contact with the surface of the data storage medium only when the write head faces a bit position on the surface, or might be continuously in contact with the surface when scanning the data storage medium.

Preferred embodiments of the present invention relate to the structure of the write head and the materials used in the write head. At least a part of the write head might comprise silicon material. In particular, if the write head comprises a cantilever, such cantilever might comprise silicon material. Also a part of the tip might be formed of silicon material. A silicon tip body might be coated by a carbon layer, the carbon layer serving as the carbon element specified above. The tip body might be entirely coated by a carbon layer for reducing the thermal resistance between the tip and the polymer layer. A sharp tip shape can be preserved if the silicon tip body is sharp, i.e. with a radius of curvature of tip apex of less than 100 nm, with a very preferred range between 5 and 20 nm, and the carbon coating is sufficiently thin, preferably between 1 and 20 nm.

In a most preferred embodiment, the carbon element is embodied as a carbon nanotube. Such a carbon nanotube, which in particular can be a multiwalled carbon nanotube, not only serves best for the heat transfer to the data storage medium, but also provides a suitable geometrical shape as well as resistance to wear.

Such a nanotube might be attached directly to a cantilever of the write head, or might be attached to a body of the tip.

With regard to the data storage medium, it is preferred that the data storage medium comprises a polymer recording layer within which data bit values are determined by the topographical state at a bit location. The surface of the polymer recording layer is scanned by the tip.

With regard to the heating element, it is preferred that the heating element comprises a resistive path for locally exerting heat at the tip when an electrical current is applied.

With regard to high-density, high data-rate applications, a data storage device is preferred wherein a plurality of write heads are arranged in the form of at least one array and the data storage medium having storage areas matching the form of the write heads.

According to another aspect of the present invention, a writing processes for writing data in such a data storage medium is separately introduced by claim 11.

According to another aspect of the present invention, there is provided a a write head. The write head comprises a heating element, and a tip for acting on a medium in an operation mode, wherein the tip is in contact with a surface of the medium and heat is applied to the tip by means of the heating element. The tip comprises a carbon element that is at least partially in contact with the surface in that operation mode.

Such a write head can be applied in a data storage device as described above. However, such a write head can also serve the purpose of structuring a medium, preferably a polymer medium. Such medium might act as a mask which will be developed in further steps once being structured. Structuring the medium typically means generating thermo-mechanically a three dimensional structure in the medium, such as e.g. a trench. Such steps can be part of a so called scanning probe lithography, wherein the step of exposure is replaced by the steps of structuring the medium thermo-meachnically with a write head comprising a heating element and a tip.

Preferred embodiments of this aspect of the invention are equivalent to the preferred embodiments of the data storage device, where applicable.

In addition, there is provided a process for generating a structure on a polymer medium, wherein the heat emitting tip is connected to a resistive path. The tip is contact with the polymer medium, and a current is driven through the resistive path thereby heating the tip to a predetermined temperature thereby causing local softening of the polymer medium to form a structure.

BRIEF DESCRIPTION OF THE DRAWINGS

Preferred embodiments of the invention will now be described, by way of example, with reference to the accompanying drawings in which.

DETAILED DESCRIPTION OF THE DRAWINGS

Figure 1A:
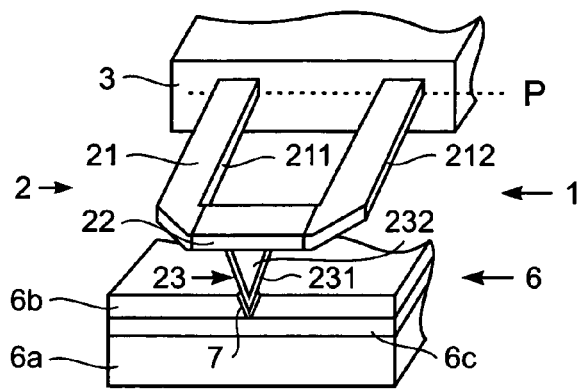
FIGS. 1a to 1c illustrate the construction and operation of a read/write head for a data storage device according to an embodiment of the present invention.
Figures 1B, 1C:
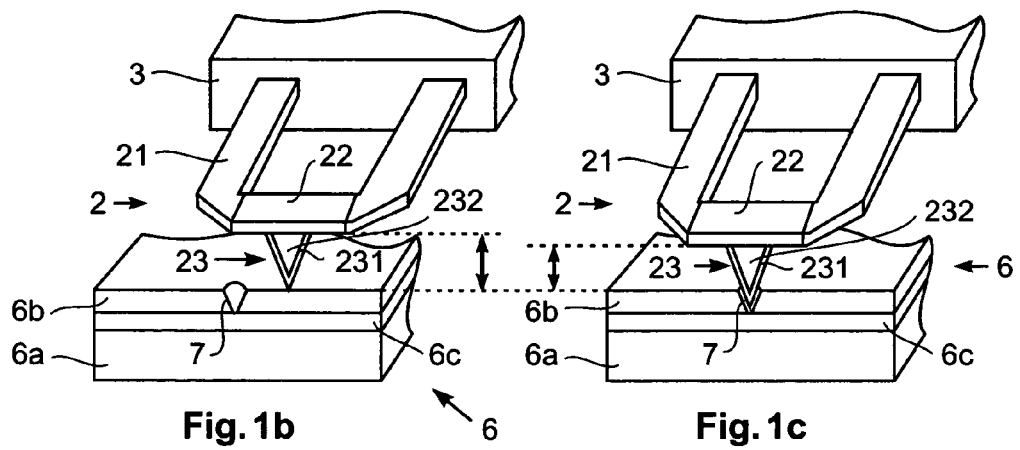

An AFM-based data storage device 1 according to an embodiment of the present invention is shown schematically in FIG. 1a to 1c of the accompanying drawings. The data storage device 1 comprises a read/write head 2, having a generally U-shaped cantilever 21 which is connected to a support structure 3 (only partially shown in the figures). Flexing of the legs 211, 212 of the cantilever 21 provides for substantially pivotal movement of the cantilever 21 about a pivot axis P. A read/write tip 23 is provided on a heating element 22 which forms a platform at the end of the cantilever 21. The highly-doped silicon cantilever legs 211, 212 define a current path connecting the heater platform 22 between a pair of electrical supply lines (not shown) on the support structure 3.

In operation, the read/write tip 23 is biased against the surface of the data storage medium of the present invention indicated schematically at 6 and shown here in cross-section.

The storage medium comprises a substrate 6a and a polymer zsurface layer 6b. Also shown in FIGS. 1a to 1c is an optional penetration stop layer 6c.

In the write mode, the heater platform 22 can be heated to a writing temperature $T_w$ by application of a write-mode potential across the supply lines. The consequent heating of the tip 23 results in heat transfer to the polymer surface layer 6b causing local softening of the polymer. This allows the tip 23 to penetrate the surface layer 6b to form a pit, or bit indentation, 7 as shown in FIG. 1a. Such a pit represents a bit of value "1", a bit of value "0" being represented by the absence of a pit. The storage medium 6 can be moved relative to read/write head 2 allowing the tip 23 to write data over an area of the surface, or "storage field", corresponding to the field of movement.

The process of reading data from the storage medium involves sensing the height of the tip with respect to a predetermined reference level. This may be accomplished by mechanically connecting a heat emitting resistive path to the tip, driving a current through the resistive path to a predetermined temperature and determining the thermal conductance between the resistive path and the storage medium. The thermal conductance between the resistive path and the storage medium 6 is a function of the distance between the heat emitting path and the surface of the storage medium 6.

In the illustrated example, in the read mode, the heater platform 22 is used as a thermal sensor by exploiting its temperature-dependent resistance. A read-mode potential is applied across the supply lines to heat the heating element 22 to a reading temperature $T_R$ which is less than the writing temperature $T_W$ and not high enough to cause softening of the polymer. As the storage field is scanned by the tip 23, the pivotal position of the cantilever 21 at each bit position differs according to the presence or absence of a pit 7. In the absence of a pit, as shown in FIG. 1b, the distance between the heater platform 22 and storage medium 6 is greater than the corresponding distance when a pit is present, and the tip enters the pit, as shown in FIG. 1c. Heat transport across the air gap between the heating element 22 and the storage medium 6 is thus more efficient when a pit is present at a bit position, and since more heat is then lost to the storage medium 6, the temperature of the heating element 22, and hence its resistance, will be reduced. Thus, as the storage field is scanned, the data bits are detected by monitoring changes in the temperature of the heating element, in practice by monitoring changes in the voltage across a series resistor in one of the supply lines.

While the operation of a single read/write head 2 has been explained above, in practice an array of such read/write heads is employed to produce a data storage device as described in the article referenced earlier.

The tip 23 comprises a carbon element indicated by reference 231. This carbon element is implemented as a carbon layer the conical shaped tip body 232 is coated with. Insofar, FIG. 1 shows a cross-sectional view of a tip 23. Such carbon element 231 is applied to the tip body 232 in a way that at least a part of the carbon element 231 is in contact with the data storage medium 6, and in particular with the polymer surface layer 6b. This improves heat transfer efficiency tremendously as will be explained in more detail with regard to another embodiment of the invention.

Figure 2:
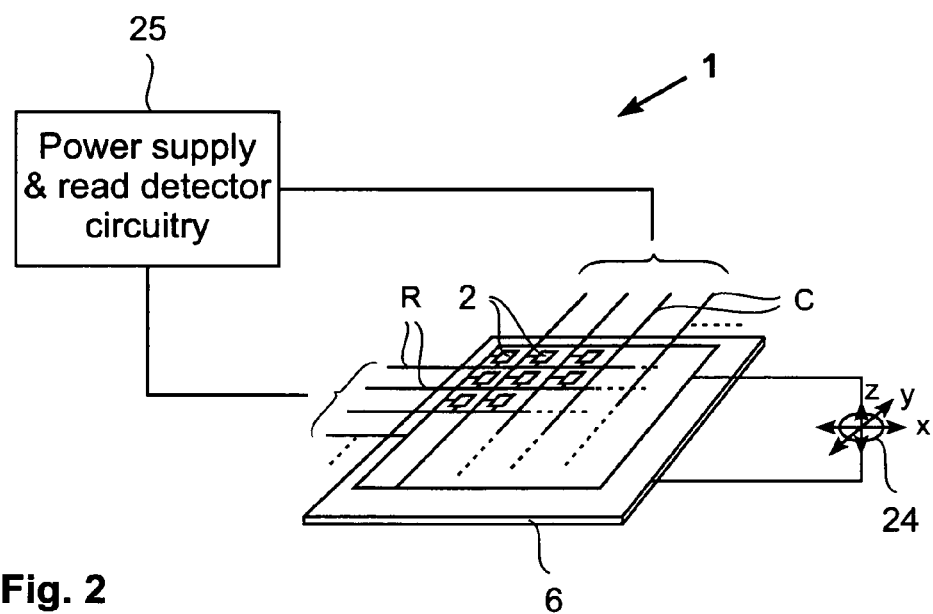
FIG. 2 is a schematic representation of a data storage device according to an embodiment of the present invention.

FIG. 2 depicts a data storage device 1 including a data storage medium 6 and a read/write apparatus as described above in the form of an array of read/write heads 2. It is to be appreciated, however, that these heads 2 may include additional circuitry, such as amplifiers etc., where required. Each read/write head 2 is connected to two supply lines, a row supply line R and a column supply line C, as indicated schematically in the figure. All heads 2 in the same row of the array share the same row supply line R. Similarly, all heads 2 in the same column of the array share the same column supply line C. Drive means, indicated schematically at 24, enables the relative movement of the array and storage medium 6, whereby the array can be accurately located in its operating position against the storage medium 6 and, during operation, each read/write head 2 can scan its individual storage field as described earlier.

The row and column lines R, C of the array are connected to power supply and read detection circuitry indicated generally at 25. Circuitry 25 operates to supply power to the components of the array, the individual read/write heads being addressed by their row and column lines in known manner via row and column multiplexers (not shown) of circuitry 25. Each read/write head 2 can be addressed in both a write mode and a read mode, the power supply circuitry supplying a write mode signal via the supply lines in the write mode, and a read mode signal via the supply lines in the read mode. The read detector circuitry of block 25 operates in the read mode to detect the bit values indicated by the read-sensing mechanisms of components 23. In general, this read detection can be performed in various ways as will be apparent to those skilled in the art. In the particular embodiments described hereinafter, however, the read detection is conveniently performed as in prior systems by measuring the voltage across series resistors connected in the column lines C of the array.

The data storage medium 6 comprises a silicon substrate having a thin layer of polymer coated thereon.

The data is written on and read from the storage medium as described in relation to FIG. 1 above, where data is stored by making pits/indentations in the thin polymer film using a cantilever with a tip. The tip is preferably conical in shape. The pit/indentation is created by heating the tip and pressing it into the polymer. If sufficient heat is transferred to raise the temperature of the polymer above a certain temperature (which is dependent on the chosen polymer), the polymer softens and the tip sinks in, creating an indentation or bit.

Figure 3:
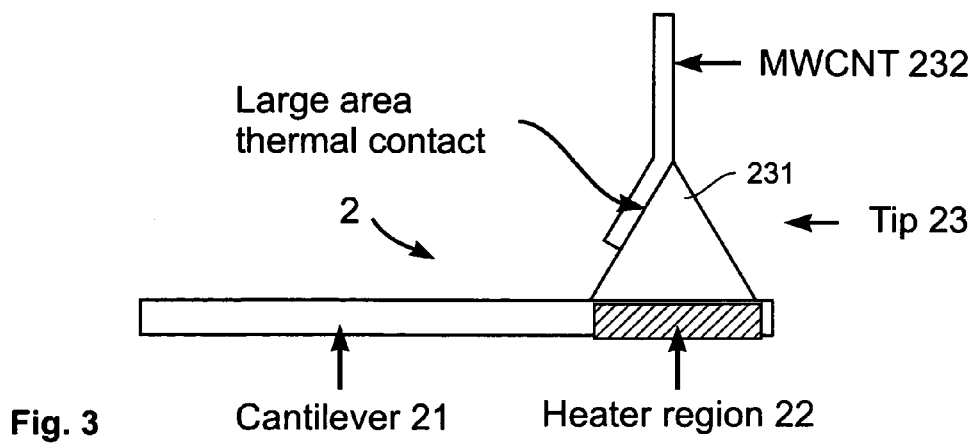
FIG. 3 illustrates a cross sectional view of another read/write head used in a data storage device according to an embodiment of the present invention.

FIG. 3 illustrates a cross-sectional view of another read/write head 2 used in a data storage device according to an embodiment of the present invention. The read/write head 2 comprises a cantilever 21 including the heating element 22 indicated at the end of the cantilever 21. A tip 23 is arranged at the end of the cantilever 21. The tip 23 comprises a silicon tip body 231 and a multiwalled carbon nanotube (MWCNT) 232 attached to the tip body 231. Instead of using a multiwalled carbon nanotube, a single walled carbon nanotube can be used. How such a carbon nanotube can be grown can be derived from Nishijima et al., Applied Physics Letters 74, 4061, (1999). A method of mounting a carbon nanotube can be derived from Shimizu et al., Surface Science, 486, L455 (2000). Both documents are incorporated by reference. Carbon nanotubes typically show a diameter of less than 10 nm and a length of less than 100 nm, preferably less than 50 nm.

With regard to heat transfer (i.e. the thermal contact resistance), investigations proved that the conventional silicon—polymer (tip—storage medium) contact shows a relatively poor heat transfer behavior in this thermo-mechanical data storage device. The situation is further complicated by the nanometer scale dimensions of the contact, as the heat has to be transferred from a relatively large area of ca. 4e6 nm^2 of the heater into a much smaller region of the polymer storage medium (ca. 900 nm^2). According to the invention, the silicon-polymer contact as such is now replaced. A new contact between carbon and polymer is introduced, which is e.g. implemented by the carbon nanotube-polymer layer contact.

However, when evaluating now the new structure with regard to heat transfer properties, in fact three thermal resistances have to taken into account:

a) the thermal resistance between the silicon tip body or the silicon cantilever—which depends on the embodied structure—and the carbon element, b) the thermal resistance of the carbon element itself which characterizes e.g. the efficiency of transporting heat along the nanotube), and c) the thermal contact resistance between the carbon element and the polymer.

The overall thermal resistance is dependent on all the three thermal resistances a) to c). The overall thermal resistance proves to transport heat better than the former silicon-polymer contact.

The overall heat efficiency can even be improved which means the thermal resistance according to a) is reduced, when the contact area between the carbon element and the silicon of the read/write head is made large, preferably larger than 1000 nm^3 with 3000 nm^3 being a typical number. The thermal resistance of a carbon nanotube as such is very low. With regard to the thermal resistance as specified in c), carbon and polymer are more similar than silicon and polymer are which tends to improve heat transport over such a contact. Experiments showed that the sum of the thermal resistances a) to c) as overall thermal resistance is lower than the thermal resistance of the conventional silicon-polymer contact.

Figure 4:
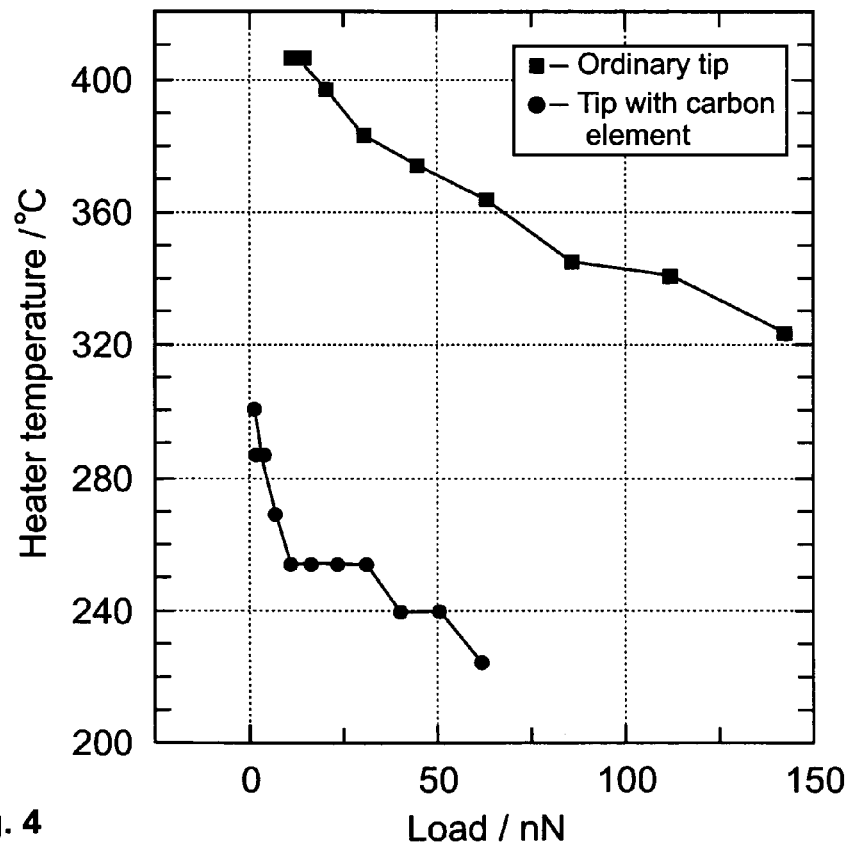
FIG. 4 shows a diagram illustrating the benefit of introducing a carbon nanotube in a tip structure with regard to minimum heater temperatures.

FIG. 4 shows a diagram, where the minimum heater temperature required to write a bit as a function of the force applied to the tip, for a bare silicon tip ("ordinary tip") in squares, and for a multiwalled carbon nanotube tip (tip with carbon element) in circles, as a function of the force applied to the tip. The temperature measured is the one of the resistive heater which scales directly with the power consumption of the bit writing process. The more force is applied to a tip the less minimum heater temperature is needed to write a bit. Note, that for higher loads applied to the carbon nanotube implemented tip, the minimum writing temperature drops by about 100 degrees Celsius which corresponds to a decrease of power consumption of more than 25%.

As the time required to write a bit is dependent on the heat capacity of the bit volume multiplied by the thermal resistance of the thermal contact between the tip and the polymer, the increased heat transfer efficiency attained with a carbon nanotube tip can also be used to attain higher writing speeds provided the writing speed is not limited by the thermal response time of the heating element.

Another advantage—in particular with regard to the nanotube embodiment—is that the tip remains sharp, even when tip wear occurs. In high-speed, high-density data storage applications, the shape of the tip should not vary in order to guarantee a constant bit size and constant writing parameters. Though the nanotube might be shortened due to operation, however no degradation in size or shape of the bits were detectable.

The invention can also be applied in the field of thermally assisted magnetic recording, or other data storage applications where heat must be transported through a point-like contact.

The invention can also be applied in a particular field of lithography, the scanned probe lithography. However, it is understood that exactly the step of exposing a photo resist to light or other electron beams can be replaced by structuring a layer of a medium by means of a heated tip in contact mode. Such structured medium can then be treated chemically in order to remove parts of the structured layer. Thus, FIG. 1 can also be interpreted as a write head for structuring a polymer layer of a medium by applying heat to the tip. Instead of a single pit, a trench might be "written" or generated in the medium by the heated tip in contact mode with the surface of the polymer layer.

What is claimed is:

1. Data storage device, comprising:
   at least one write head, the write head comprising a heating element and a tip; and
   a data storage medium, wherein in an operation mode of the data storage device the tip is in contact with a surface of the data storage medium and heat is applied to the tip by means of the heating element,
   wherein the tip comprises a silicon tip body and a carbon nanotube element having a first portion extending in a first direction and a second portion extending in a second direction, wherein the first direction is substantially perpendicular to a surface of the heating element and the second direction is substantially parallel to a surface of the silicon tip body, and wherein the first portion of the carbon nanotube element is at least partially in contact with the surface of the data storage medium in the operation mode.

2. Data storage device according to claim 1, wherein the write head comprises silicon material.

3. Data storage device according to claim 1, wherein the write head comprises a cantilever.

4. Data storage device according to claim 1, wherein the surface is a surface of a polymer recording layer within which data bit values are determined by the topographical state at a bit location.

5. Data storage device according to claim 1, wherein the operation mode comprises a writing operation for writing information on the data storage medium, an erasing operation for erasing information from the data storage medium, or a combination thereof.

6. Data storage device according to claim 1, wherein the heating element comprises a resistive path for locally exerting heat at the tip when an electrical current is applied.

7. Data storage device according to claim 1, wherein a plurality of read/write heads are arranged in the form of at least one array and the data storage medium having storage areas matching the form of the read/write heads.

8. Data storage device according to claim 1, wherein:
   a current is driven through a resistive path connected to the heating element thereby heating the tip to a predetermined minimum data writing temperature thereby causing local softening of a polymer recording layer of the data storage medium allowing penetration of the first portion of the carbon nanotube element to form a pit.

9. Data storage device according to claim 8, wherein data is stored in a binary code and the absence of a pit on the polymer recording layer represents a zero data bit and the presence of a pit represents a 1 data bit.

10. A write head, comprising:
    a heating element; and
    a tip for acting on a medium in an operation mode, wherein the tip is in contact with a surface of the medium and heat is applied to the tip by means of the heating element,
    wherein the tip comprises a conical silicon tip body and a carbon nanotube element having a first portion extending in a first direction and a second portion extending in a second direction, wherein the first direction is substantially perpendicular to a surface of the heating element and the second direction is substantially parallel to a surface of the silicon tip body, wherein the second portion of the carbon nanotube element contacts a portion of a lateral surface of the conical silicon tip body, wherein a bend is formed in the carbon nanotube element at an apex of the conical silicon tip body, and wherein the first portion of the carbon nanotube element is at least partially in contact with the surface of the data storage medium in the operation mode.

11. A write head according to claim 10, wherein the operation mode comprises generating thermo-mechanically a three-dimensional structure in the medium.

12. A write head according to claim 10, wherein the write head comprises silicon material.

13. A write head according to claim 10, wherein the write head comprises a cantilever.

14. A write head according to claim 10, wherein the heating element comprises a resistive path for locally exerting heat at the tip when an electrical current is applied.

15. A write head according to claim 10, wherein:
the tip is connected to a resistive path, in contact with the medium; and
a current is driven through the resistive path thereby heating the tip to a predetermined temperature thereby causing local softening of the medium to form a structure.

* * * * *